(12) United States Patent
Venca

(10) Patent No.: US 12,224,664 B2
(45) Date of Patent: Feb. 11, 2025

(54) GATE CONTROLLER FOR A CHARGE PUMP CONVERTER

(71) Applicant: EM Microelectronic-Marin SA, Marin (CH)

(72) Inventor: Alessandro Venca, Hauterive (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 17/770,094

(22) PCT Filed: Nov. 5, 2020

(86) PCT No.: PCT/EP2020/081170
§ 371 (c)(1),
(2) Date: Apr. 19, 2022

(87) PCT Pub. No.: WO2021/089718
PCT Pub. Date: May 14, 2021

(65) Prior Publication Data
US 2022/0393581 A1    Dec. 8, 2022

(30) Foreign Application Priority Data
Nov. 5, 2019   (EP) ..................... 19207239

(51) Int. Cl.
*H02M 3/07*    (2006.01)
*H02M 1/08*    (2006.01)
(Continued)

(52) U.S. Cl.
CPC ............. *H02M 3/07* (2013.01); *H02M 1/08* (2013.01); *H02M 1/36* (2013.01); *H02M 3/285* (2013.01)

(58) Field of Classification Search
CPC .......... H02M 3/07; H02M 3/285; H02M 1/08; H02M 1/36; G11C 5/145
See application file for complete search history.

(56) References Cited

U.S. PATENT DOCUMENTS 5,689,208 A  * 11/1997  Nadd ................... H03K 17/168
                                                 327/390
8,072,258 B2 * 12/2011  Yamahira .............. H02M 3/073
                                                 327/536
(Continued)

FOREIGN PATENT DOCUMENTS

JP         2001-211637 A      8/2001

OTHER PUBLICATIONS

Toshiba, "MOSFET Gate Drive Circuit Application Note", Retrieved from the Internet: URL:https://toshiba.semicon-storage.com, [retrieved on Sep. 13, 2019], 2018, 22 pages.
(Continued)

*Primary Examiner* — Sibin Chen
(74) *Attorney, Agent, or Firm* — Sughrue Mion, PLLC

(57) ABSTRACT

Provided is a gate controller having a primary signal input which is AC coupled to the gate through a capacitor, one or more bias inputs each connected to the gate through a resistor such as to control the DC voltage bias of the gate and therefore the conductivity o the switching element. The bias inputs can be properly connected to internal nodes of the charge pump, or charge pump stages, such that the gate controller is self-biased, without using bias-reference external to the charge pump. The gate controller is programmable by using potentiometers in place of the bias resistors. The programmable gate controller stages can be connected to form a programmable gate controlled charge pump.

13 Claims, 12 Drawing Sheets

(51) Int. Cl.
 H02M 1/36 (2007.01)
 H02M 3/28 (2006.01)

(56) References Cited

U.S. PATENT DOCUMENTS

| | | | | |
|---|---|---|---|---|
| 2002/0130704 A1* | 9/2002 | Myono | ............... | H02M 3/073 |
| | | | | 327/536 |
| 2005/0213781 A1* | 9/2005 | Suzuki | ............... | H02M 3/073 |
| | | | | 381/104 |
| 2006/0050461 A1* | 3/2006 | Bolz | ............... | H03K 17/6874 |
| | | | | 361/103 |
| 2006/0255853 A1* | 11/2006 | Masuko | ............... | H02M 3/073 |
| | | | | 327/536 |
| 2007/0273431 A1* | 11/2007 | Sakurai | ............... | H02M 3/07 |
| | | | | 327/537 |
| 2018/0069546 A1* | 3/2018 | Shankar | ............ | H03K 17/08122 |

OTHER PUBLICATIONS

John F. Dickson, "On-Chip High-Voltage Generation in MNOS Integrated Circuits Using an Improved Voltage Multiplier Technique", IEEE Journal of Solid-State Circuits, 1976, pp. 374-378, vol. SC-11, No. 3.

International Search Report of PCT/EP2020/081170 dated Jan. 29, 2021 [PCT/ISA/210].

Written Opinion of PCT/EP2020/081170 dated Jan. 29, 2021 [PCT/ISA/237].

* cited by examiner

GATE CONTROLLER FOR A CHARGE PUMP CONVERTER

CROSS REFERENCE TO RELATED APPLICATIONS

This application is a National Stage of International Application No. PCT/EP2020/081170 filed on Nov. 5, 2020, claiming priority based on European Patent Application No. 19207239.5 filed on Nov. 5, 2019.

TECHNICAL FIELD

The present invention relates to the field of charge pump converter and in particular of a stage of charge pump converter. More specifically, this invention deals with gate controller for a charge pump converter stage.

STATE OF THE ART

Charge pump is well known in the art, however, the active device, and more particularly the transistor, in diode configuration, is not controllable and as a consequence the charge pump input impedance and efficiency are largely dependent on the active device threshold voltage which varies with process corners and temperature.

The present invention discloses a gate controller for a charge pump converter stage, to control the gate bias voltage of the active device in a charge pump such that the charge pump input impedance and efficiency are more constant across process and temperature variations.

SUMMARY OF THE INVENTION

The present invention relates to a gate controller for a charge pump converter stage, preferably of a charge pump converter stage, said charge pump converter stage comprising at least one switching element having a conduction path with a first terminal and a second terminal, and a gate configured to control the current flowing through said conduction path, said conduction path being configured to provide at least one primary signal, preferably; said gate controller comprising at least one:
  primary signal input: said at least one primary signal input is connected to, preferably directly connected to a second terminal of a charge pump converter stage and/or to receive a signal, preferably from an antenna, from an integrated circuit, at least one primary signal and/or from a charge pump converter stage and to transfer said signal to said first terminal of conduction path of said at least one switching element; and
  bias input: said at least one bias input is connected to, preferably directly connected to said gate and to establish a voltage value and/or a current value of said gate.

Thanks to the arrangements according to the invention, the gate controller allows adjusting the bias voltage of the gate by coupling the gate of the switching element to the output of the previous charge pump converter stage and said at least one bias input, which sets the DC gate's voltage reference bias.

More specifically, the present invention relates to a gate controller having a primary signal input which is AC coupled to the gate, one or more bias input each connected to the gate through a resistor or a transistor such as to control the DC voltage bias of the gate and therefore the conductivity of the switching element.

Said bias inputs can be properly connected to internal nodes of the charge pump, or charge pump stages, such that the gate controller is self-biased (biased without using bias-reference external to the charge pump).

Said gate controller can be made programmable by using potentiometers in place of the bias resistors.

According to an embodiment, said second terminal is a signal output.

According to an embodiment, said gate controller comprises at least one primary coupling capacitor configured to be connected directly to said gate and at least one first secondary signal input configured to be connected directly to said at least primary coupling capacitor; said at least one first secondary signal input is configured to receive a first control signal.

Thanks to the arrangements according to the invention, said gate may be controlled through a first control signal.

According to an embodiment, said gate controller comprises at least one attenuator and at least one second secondary signal input configured to be connected directly to said at least one attenuator; said at least one second secondary signal input is configured to receive at least one secondary signal.

Thanks to the arrangements according to the invention, said at least one primary signal may be attenuated or amplified through said at least one attenuator.

According to an embodiment, said at least one attenuator comprises at least one first secondary capacitor configured to be connected directly between said at least one second secondary signal input and said second terminal.

According to an embodiment, said at least one attenuator comprises at least one second secondary capacitor configured to be connected directly between said ground and said second terminal.

Thanks to one of those the arrangements according to the invention, the attenuation or the amplification of said at least one primary signal may be controlled through said at least one attenuator.

According to an embodiment, said at least one attenuator comprises at least one first secondary trim input configured to trim the capacitance of said at least one first secondary capacitor and/or the capacitance of said at least one second secondary capacitor and/or wherein said at least one attenuator comprises at least one second secondary trim input configured to trim said capacitance of said at least one second secondary capacitor.

Thanks to the arrangement according to the invention, the attenuation or the amplification of said at least one primary signal may be trimmed through said at least one first secondary trim input and/or said at least one second secondary trim input.

According to an embodiment, said gate controller comprises at least one coupling capacitor configured to connect said gate to said at least one primary signal input and/or to connect said conduction path of said at least one switching element to said gate.

Thanks to the arrangements according to the invention, the gate controller allows adjusting the bias voltage of the gate by coupling the gate of the switching element to the output of the previous charge pump converter stage through a coupling capacitor and said at least one bias input, which sets the DC gate's voltage reference bias.

More specifically, the present invention relates to a gate controller having a primary signal input which is AC coupled to the gate through a capacitor, one or more bias input each connected to the gate through a resistor or a transistor such as to control the DC voltage bias of the gate and therefore the conductivity of the switching element.

According to an embodiment, said at least one bias input is connected to, preferably directly connected to said at least one primary signal input.

According to an embodiment, said at least one bias input comprises a plurality of bias current flow controller comprising at least one first bias current flow controller and/or at least one first bias transistor.

Thanks to the arrangements according to the invention, the conduction path of the switching element may be controlled.

According to an embodiment, said plurality of bias current flow controller comprises at least one second bias current flow controller and/or at least one second bias transistor.

Thanks to the arrangements according to the invention, the conduction path of the switching element may be controlled.

According to an embodiment, said at least one second bias current flow controller is connected to, preferably directly connected to said gate and said second terminal of conduction path of said at least one switching element.

According to an embodiment, wherein said at least one first bias current flow controller comprises at least one resistor, a potentiometer and/or a digital potentiometer and/ or wherein said at least one second bias current flow controller comprises at least one resistor, a potentiometer and/or a digital potentiometer.

Thanks to the arrangements according to the invention, the conduction path of the switching element may be controlled which makes the charge pump converter programmable.

According to an embodiment, said at least one first bias current flow controller and/or said at least one first bias transistor comprises or comprise at least one first primary trim input configured to trim the current flowing through said at least one first bias current flow controller and/or said at least one first bias transistor and/or wherein said at least one second bias current flow controller and/or said at least one second bias transistor comprises or comprise at least one second primary trim input configured to trim the current flowing through said at least one first bias current flow controller and/or said at least one first bias transistor.

Thanks to the arrangements according to the invention, the conduction path of the switching element may be controlled which makes the charge pump converter programmable via an integrated circuit, a microcontroller and/or a processor.

The present invention relates also to a charge pump converter comprising a plurality of charge pump converter stages including at least one first charge pump converter stage, a second charge pump converter stage and a third charge pump converter stage, and said gate controller according to any precedent claims, wherein said plurality of bias current flow controller of said third charge pump converter stage is connected to said second terminal of said first charge pump converter stage and said at least one bias input of said third charge pump converter stage is connected to said second terminal of said second charge pump converter stage.

Thanks to the arrangements according to the invention, the charge pump converter stages are linked together.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in which.

DESCRIPTION OF THE INVENTION

Figure 1:
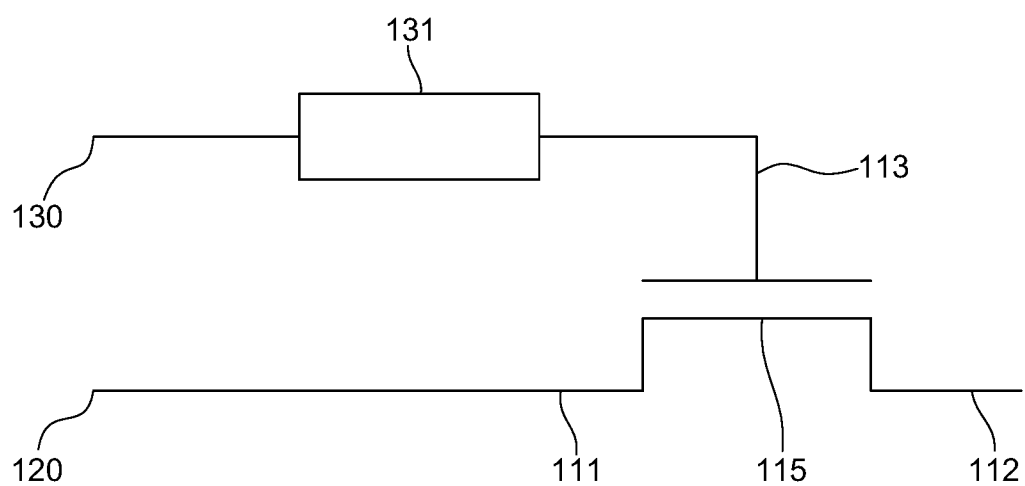
FIG. 1 represent a gate controller according to an embodiment of the invention.

Specific embodiments of the invention will now be described in detail with reference to the accompanying figures. Like elements in the various figures are denoted by like reference numerals for consistency. Further, the use of "Fig." will be equivalent to the use of "figure" in the description.

In the following description of the embodiments of the invention numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Description of the Invention According to a First Embodiment

The present invention relates a gate controller 100 for a charge pump converter stage 101, preferably of a charge pump converter stage 101 as depicted in FIG. 1. Said charge pump converter stage 101 comprising at least one switching element 110 having a conduction path 115 with a first terminal 111 and a second terminal 112, and a gate 113 configured to control the current flowing through said conduction path 115, said conduction path 115 being configured to provide at least one signal. Said gate controller 100 comprises at least one primary signal input 120 and at least one bias input 130.

Said at least one primary signal input 120 may be connected to, preferably directly connected to a second terminal 112 of a charge pump converter stage 101 and/or to receive a signal, preferably from an antenna, from an integrated circuit and/or from a charge pump converter stage and to transfer said signal to said first terminal 111 of conduction path 115 of said at least one switching element 110.

Said at least one bias input 130 may be connected to, preferably directly connected to said gate 113 and to establish a voltage value and/or a current value of said gate 113. So the gate controller allows adjusting the bias voltage of the gate by coupling the gate of the switching element to the output of the previous charge pump converter stage and said at least one bias input, which sets the DC gate's voltage reference bias.

Description of the Invention According to a Second Embodiment

Figure 2A:
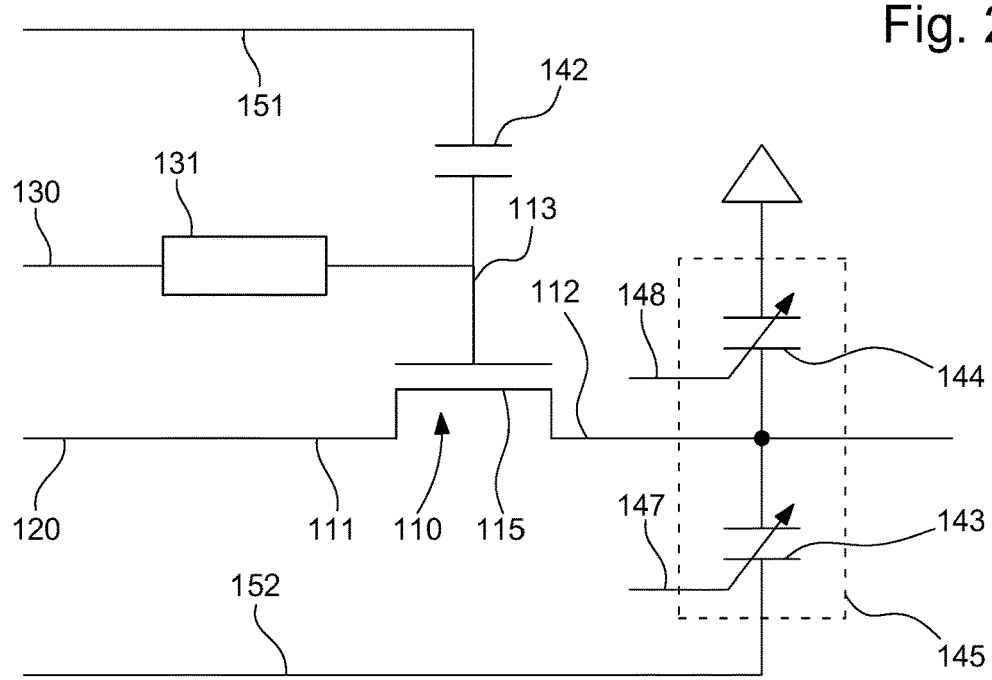
FIGS. 2A and 2B represent a gate controller and a signal diagram as function of the time respectively according to an embodiment of the invention.

According to a third embodiment shown on FIG. 2A, a gate controller 100 comprises at least one primary coupling capacitor 142 configured to be connected directly to said gate 113 and at least one first secondary signal input 151 configured to be connected directly to said at least primary coupling capacitor 142. Said at least one first secondary signal input 151 may be configured to receive a first control signal, preferably a clock signal being a square wave signal or sinusoidal signal.

Illustrated on FIG. 2A, said at least one bias input 130 may be connected to the gate 113 through a resistor 131 or a transistor 136 such as to control the DC voltage bias of the gate $V_{DC}$ S130 and therefore the conductivity of the switching element 110. However, since said gate controller 100 of the second embodiment comprises at least one attenuator 145 and at least one second secondary signal input 152 configured to be connected directly to said at least one attenuator 145. Said at least one second secondary signal input 152 may be configured to receive a main signal or at least one secondary signal.

As said first embodiment, said at least one switching element 110 comprises said conduction path 115 between said first terminal 111 and said second terminal 112, and said gate 113 controlling the current flowing through said conduction path 115. Said gate controller 100 comprises also at least one primary signal input 120 connected to, preferably directly connected to a second terminal 112 of an another charge pump converter stage, as shown on FIG. 15, and/or to receive a signal, preferably from an antenna, from an integrated circuit, at least one primary signal and/or from another charge pump converter stage.

The bias voltage of said at least one bias input 130 and the signal amplitude via said at least one first secondary signal input 151 are independent from said bias voltage and signal amplitude voltage of said at least one primary signal input 120.

As example, the following formula describes a sinusoidal clock signal RFin(X) from said at least one second secondary signal input 152:

$$RFin(X) = RFin_{0-pk} \cdot \sin(2\pi ft)$$

X being the number of said gate controller 100, for example the third gate controller 100 would be written as follow: RFin(3).

Neglecting the stray capacitance, the input voltage of the X-gate controller 100, rather the voltage of said at least one primary signal input 120 could be written as:

$$OUT(X-1) = K \cdot (X-1) \cdot (2RFin_{0-pk} - V_{diode}) + K \cdot RFin_{0-pk} \cdot \sin(2\pi ft)$$

and the gate voltage on said gate 113 of the X-gate controller 100 is:

$$G(X) = vbiasX + RFin_{0-pk} \cdot \sin(2\pi ft)$$

Where K being an attenuation coefficient or an amplification coefficient.

Indeed, said at least one attenuator 145 comprises at least one first secondary capacitor 143 configured to be connected directly between said at least one second secondary signal input 152 and said second terminal 112, and at least one second secondary capacitor 144 configured to be connected directly between said ground and said second terminal 112, as shown on FIG. 2A.

$$K = \frac{C_{143}}{C_{143} + C_{144}}$$

Figure 15:
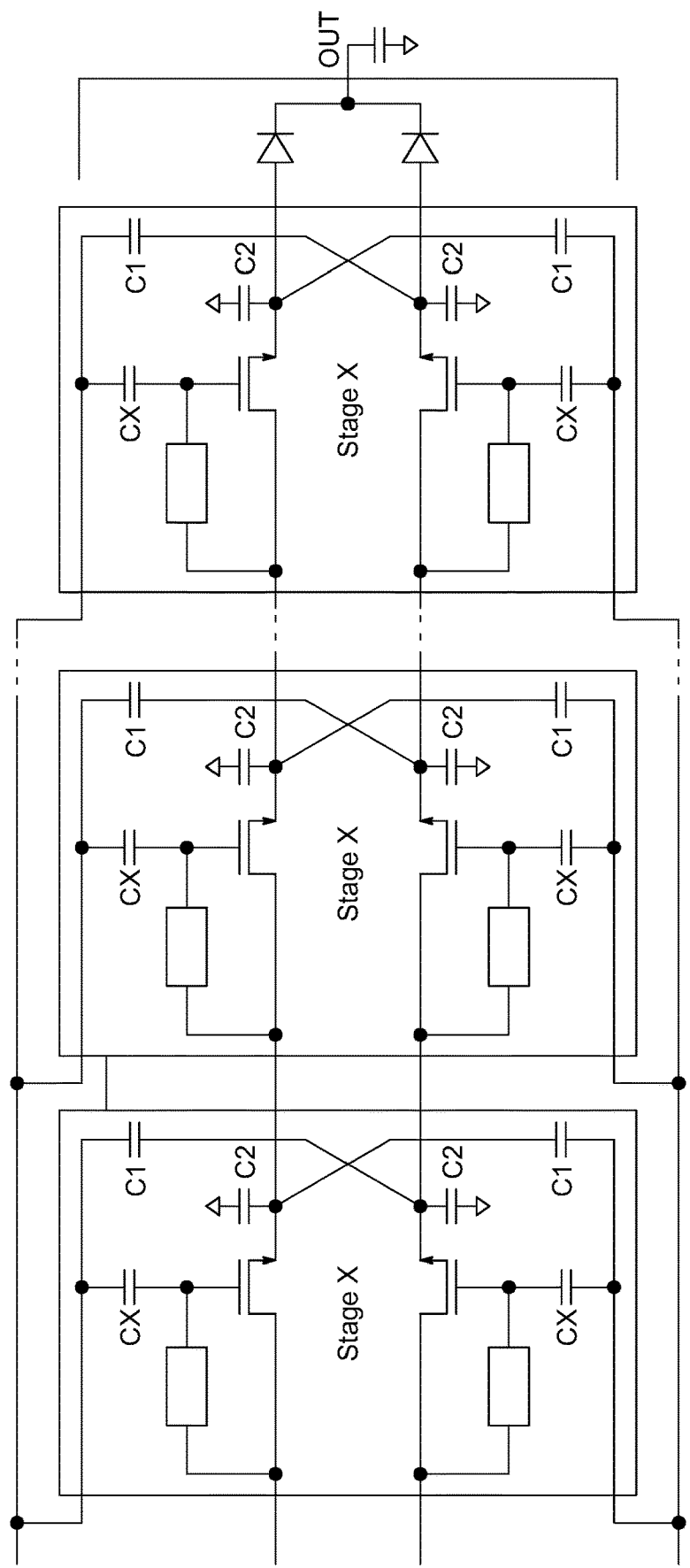

Further, said at least one bias input 130 can be properly connected to a bias-reference external to the charge pump or alternatively to an internal node of the charge pump, or charge pump stages, as shown on FIG. 15, such that the gate controller may be self-biased without using bias-reference external to the charge pump.

Said at least one primary signal S120 received on said at least one primary signal input 120 may be then transferred to said first terminal 111 of conduction path 115 of said at least one switching element 110, as shown in FIG. 2A for example, such as said conduction path 115 may provide a signal to another at least one charge pump converter stage, as shown on FIG. 15.

As aforementioned, said gate 113 may control the current flowing through said conduction path 115, and for that, said gate controller 100 for a charge pump converter stage 101 may be provided with at least one bias input 130 connected to, preferably directly connected to said gate 113 and to establish a voltage value and/or a current value to said gate 113, in such a way that the current flowing through said conduction path 115 may be varied in amplitude, frequency, and/or in phase.

Further, said bias voltage of said at least one bias input 130 can be made equal to the signal amplitude voltage of said at least one primary signal input 120, for example, or by connecting to any other gate controller 100 of a charge pump converter stage 101 or to a voltage generated external to said charge pump converter stage 101.

Description of the Invention According to a Third Embodiment

Figure 3A:
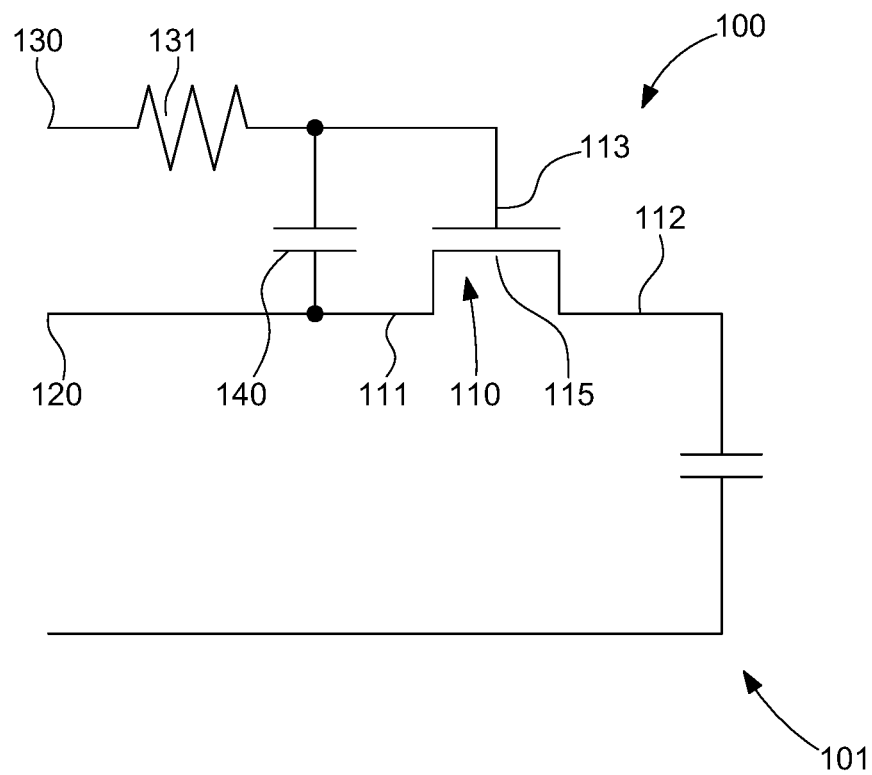
FIGS. 3A and 3B represent a gate controller and a signal diagram as function of the time respectively according to an embodiment of the invention.

As illustrated in FIG. 3A, said gate controller 100 has a primary signal input 120 which may be AC coupled to the gate 113 through a capacitor 140, one or more bias input 130 each connected to the gate 113 through a resistor 131 or a transistor 136 such as to control the DC voltage bias of the gate $V_{DC}$ S130 and therefore the conductivity of the switching element 110.

Figure 13:
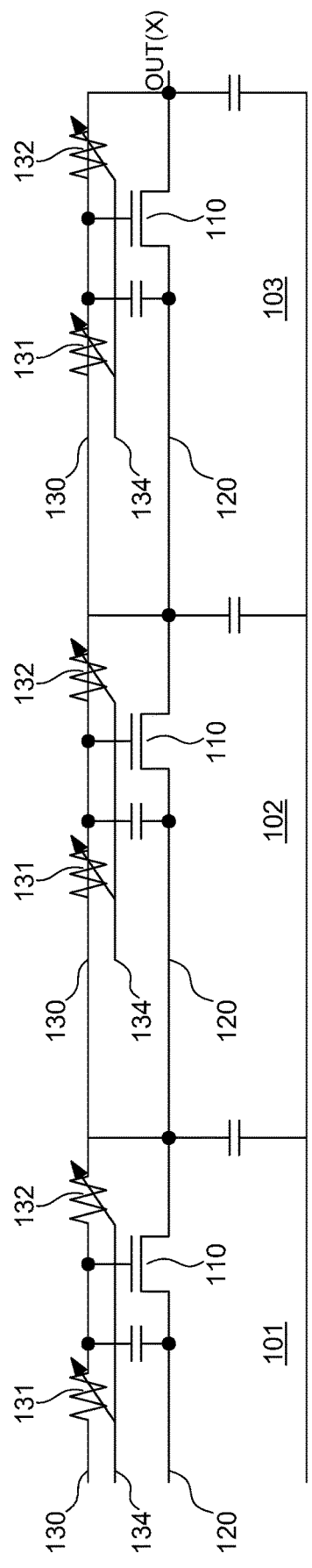
FIG. 13-15 represent charge pump converters comprising at least one gate controller according to embodiments of the invention.
Figure 14:
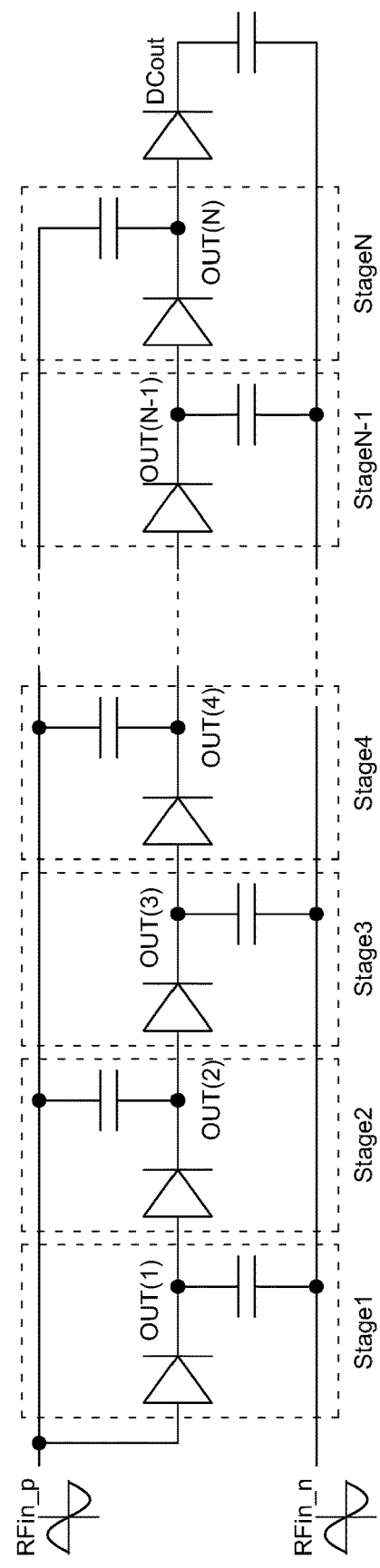

Said bias inputs can be properly connected to a bias-reference external to the charge pump or alternatively to an internal node of the charge pump, or charge pump stages, as shown on FIG. 13, such that the gate controller may be self-biased without using bias-reference external to the charge pump.

According to this third embodiment shown on FIG. 3A, a gate controller 100 for a charge pump converter stage 101 may be disclosed. This gate controller 100 may be a stage of charge pump converter and comprises at least one switching element 110, which may be typically a transistor, having a conduction path 115 between a first terminal 111, which may be typically a drain, and a second terminal 112, which may be typically a source, and a gate 113 configured to control the current flowing through said conduction path 115. By controlling, the skilled man in the art would understand that the current flowing through said conduction path 115 may be varied in amplitude, frequency, and/or in phase such as to be transmitted to another charge pump converter stage 102, 103 for instance as shown in FIG. 13.

Said gate controller 100 comprises also at least one primary signal input 120 connected to, preferably directly connected to a second terminal 112 of an another charge pump converter stage, as shown on FIG. 13, and/or to receive a signal, preferably from an antenna, from an integrated circuit and/or from another charge pump converter stage.

Said received signal may be then transferred to said first terminal 111 of conduction path 115 of said at least one switching element 110, as shown in FIG. 3A for example, such as said conduction path 115 may provide a signal to another charge pump converter stage, as shown on FIG. 13.

As aforementioned, said gate 113 may control the current flowing through said conduction path 115, and for that, said gate controller 100 for a charge pump converter stage 101 may be provided with at least one bias input 130 connected to, preferably directly connected to said gate 113 and to establish a voltage value and/or a current value to said gate 113, in such a way that the current flowing through said conduction path 115 may be varied in amplitude, frequency, and/or in phase.

Further, said gate controller 100 may comprise at least one coupling capacitor 140 connected between said at least one bias input 130, said at least one primary signal input 120. Said at least one coupling capacitor 140 may also be connected between said gate 113 and said conduction path 115 of said at least one switching element 110.

Thus, the bias voltage of the gate $V_{DC}$ S130 may be adjusted by coupling the gate of the switching element 110 to the output of the previous charge pump converter stage 101 through at least one coupling capacitor 140 and said at least one bias input 130, which sets the DC gate's voltage reference bias $V_{DC}$ S113. In fact, as shown in FIG. 3B, a radio frequency signal S120 may be received by said charge pump converter and transferred to said charge pump converter stage 101, and more particularly to said at least one primary signal input 120.

Figure 3B:
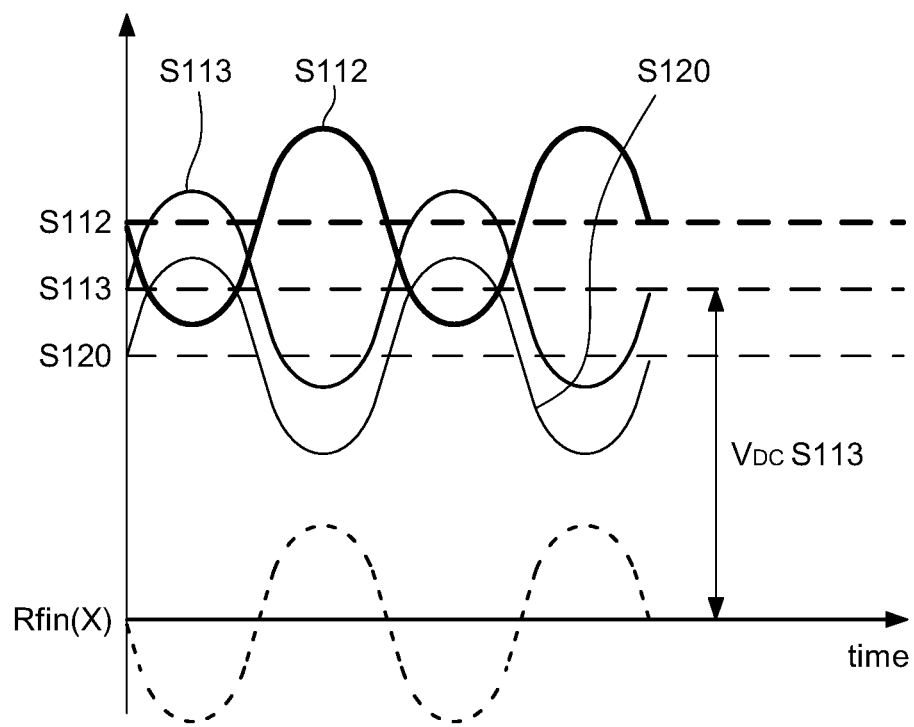

This signal may go through said at least one coupling capacitor 140 and may be added some offset, as shown in FIG. 3B with reference S113. The input signal AC S120, coming from said at least one primary signal input 120, couples to said gate 113 through said at least one coupling capacitor 140. The DC or offset $V_{DC}$ S113 of said gate 113 may be provided by said at least one bias input 130. By controlling the DC or offset, said gate 113 the conductivity of the switching element may be controlled. As it may be construed from the previous description, the present invention relates to a gate controller 100 having a primary signal input 120 which may be AC coupled to the gate 113 through a capacitor 140, one or more bias input 130 each connected to the gate 113 through a resistor 131 such as to control the DC voltage bias of the gate and therefore the conductivity of the switching element.

Said bias inputs can be properly connected to internal nodes of the charge pump, or charge pump stages, such that the gate controller may be self-biased, without using bias-reference external to the charge pump.

Description of the Invention According to a Fourth and a Fifth Embodiment

Figure 4A:
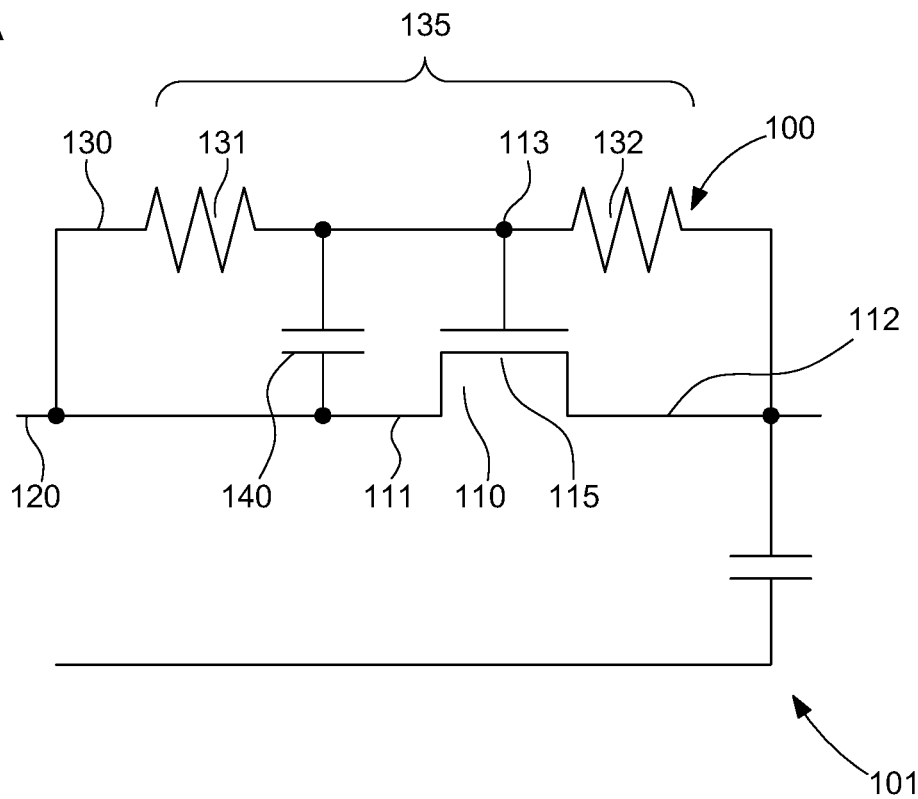
FIGS. 4A and 4B represent a gate controller and a signal diagram as function of the time respectively according to an embodiment of the invention.

According to a second embodiment shown on FIG. 4A, a gate controller 100 for a charge pump converter stage 101 may be disclosed. The difference with the previous embodiment may be that said at least one bias input 130 may be connected to said at least one primary signal input 120 via said at least one first bias current flow controller 131 and said gate 113 may be connected to said second terminal 112 also via at least one second bias current flow controller 132 and/or at least one second bias transistor 137 thus the conduction path 115 of the switching element 110 may be controlled.

Figure 4B:
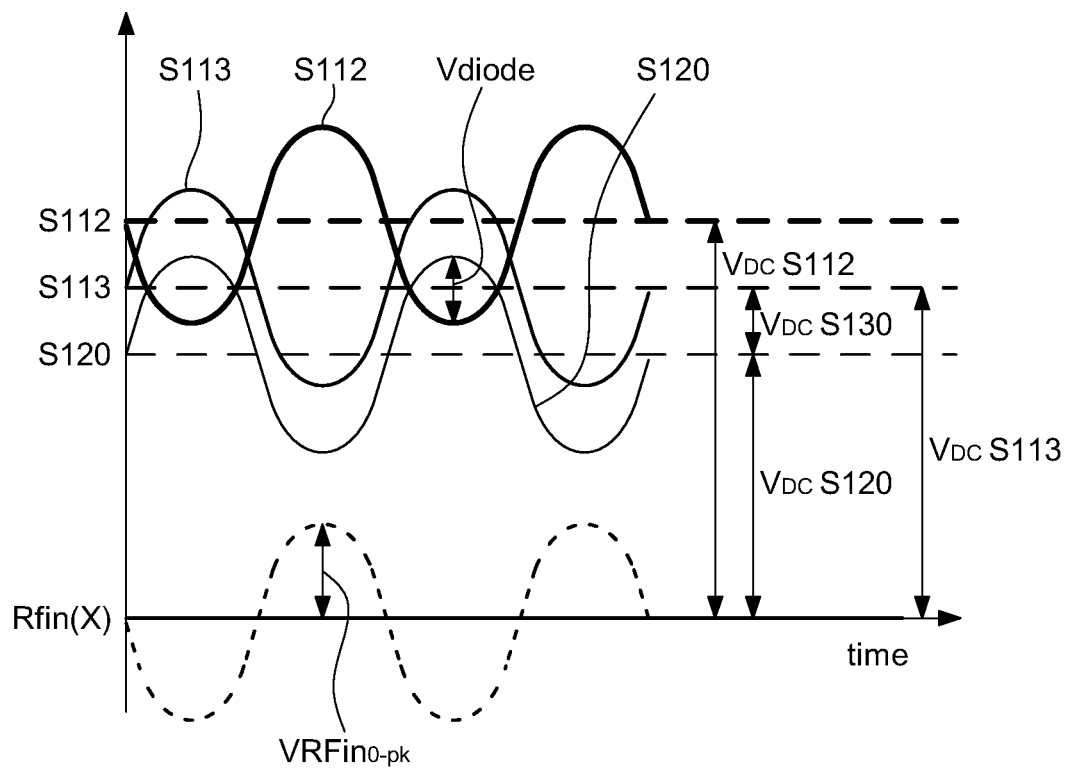

In this embodiment, the gate voltage of said gate 113 may be determined by configuration of said at least one first bias current flow controller 131 and at least one second bias current flow controller 132. More precisely, when the second embodiment comprises at least one resistor as said at least one first bias current flow controller 131 and/or as said at least one second bias current flow controller 132 a resistive divider may be formed and the DC gate voltage $V_{DC}$ S113 may be comprised between the voltage value of said at least one primary signal input 120, referenced $V_{DC}$ S120, and of said second terminal 112, in other words, the added offset to the signal may be comprised between the voltage value of said at least one primary signal input 120, referenced $V_{DC}$ S120, and of said second terminal 112, referenced $V_{DC}$ S112, as shown in FIG. 4B.

Figure 5A:
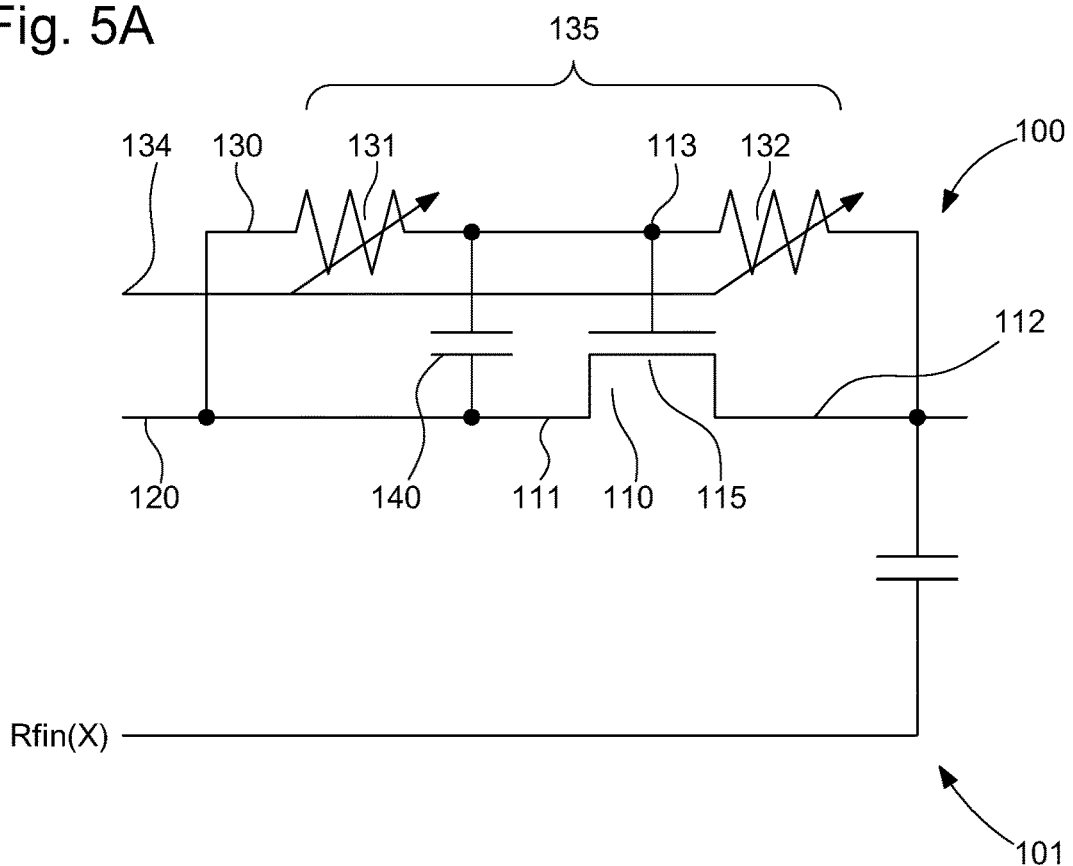
FIGS. 5A-9 represent gate controllers according to embodiments of the invention.
Figure 5B:
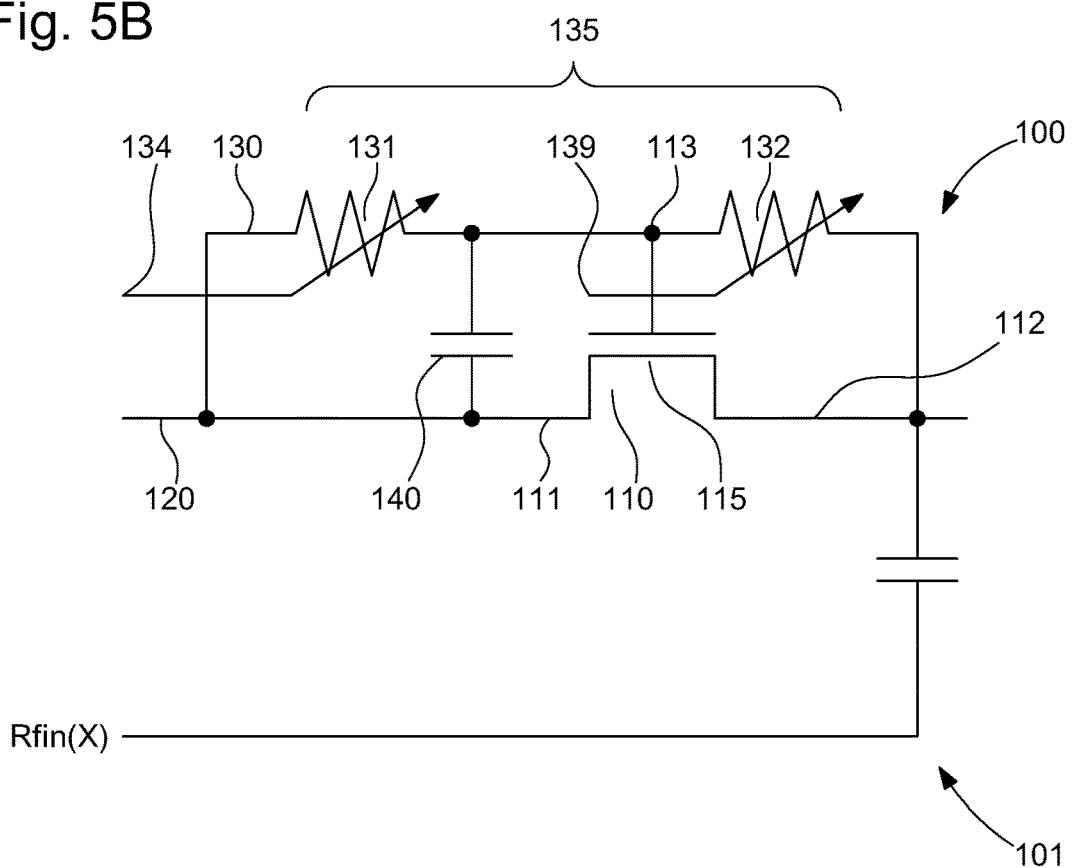

As shown in FIG. 5A, said at least one first bias current flow controller 131 may comprise at least one first primary trim input 134 configured to trim the current flowing through said at least one first bias current flow controller 131, referenced S134, and/or wherein said at least one second bias current flow controller 132 may comprise at least one second primary trim input 139 configured to trim the current flowing through said at least one first bias current flow controller 131, as depicted in FIG. 5B.

Thanks to the arrangements according to the invention, the conduction path 115 of the switching element 110 may be controlled which makes the charge pump converter programmable via an integrated circuit, a microcontroller and/or a processor.

As it may be construed from the previous description, the present invention relates to a gate controller 100 having a primary signal input 120 which may be AC coupled to the gate 113 through a capacitor 140, one or more bias input 130 each connected to the gate 113 through a resistor 131 such as to control the DC voltage bias of the gate and therefore the conductivity of the switching element.

Said bias inputs can be properly connected to internal nodes of the charge pump, or charge pump stages, such that the gate controller may be self-biased, without using bias-reference external to the charge pump.

Said gate controller can be made programmable by using potentiometers in place of the bias resistors.

Figure 6:
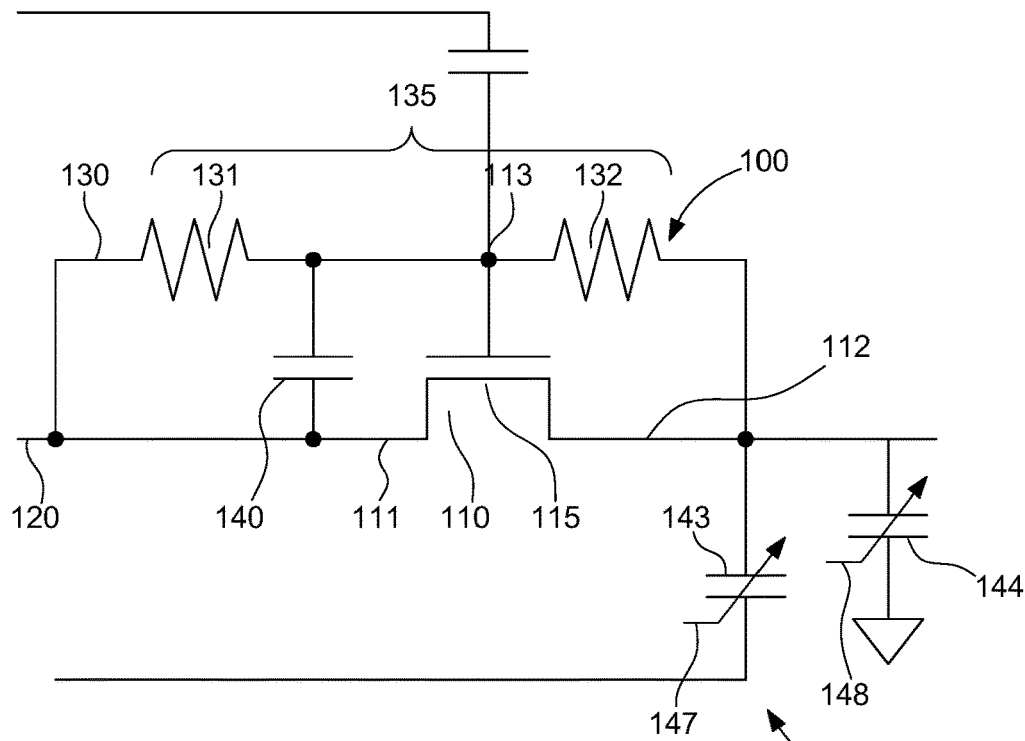

Said programmable gate controller stages can be connected to form a programmable gate controlled charge pump Description of the Invention According to a Sixth and Seventh Embodiment On FIG. 6, a gate controller 100 for a charge pump converter stage 101 may be disclosed. The difference with the others embodiments may be that said at least one bias input 130 may be connected to said at least one primary signal input 120 via said at least one first bias current flow controller 131 and said gate 113 may be connected to said second terminal 112 also via at least one second bias current flow controller 132 and/or at least one second bias transistor 137 thus the conduction path 115 of the switching element 110 may be controlled.

On top of that, said at least one attenuator 145 may comprise at least one first secondary trim input 147 configured to trim the capacitance $C_{143}$ of said at least one first secondary capacitor 143 and/or the capacitance $C_{144}$ of said at least one second secondary capacitor 144. On FIG. 6, said at least one first secondary trim input 147 may trim only the capacitance $C_{143}$ of said at least one first secondary capacitor 143 such as to trim totally or partially the attenuation or the amplification of at least one primary signal through said at least one first secondary trim input 147.

In order to trim said capacitance $C_{144}$ of said at least one second secondary capacitor 144, said at least one attenuator 145 may comprise at least one second secondary trim input 148, such as to trim totally or partially the attenuation or the amplification of said at least one primary signal through said at least one second secondary trim input 148.

Said at least one first secondary trim input 147 and said at least one second secondary trim input 148 may be controlled via an integrated circuit, a microcontroller and/or a processor.

Figure 2B:
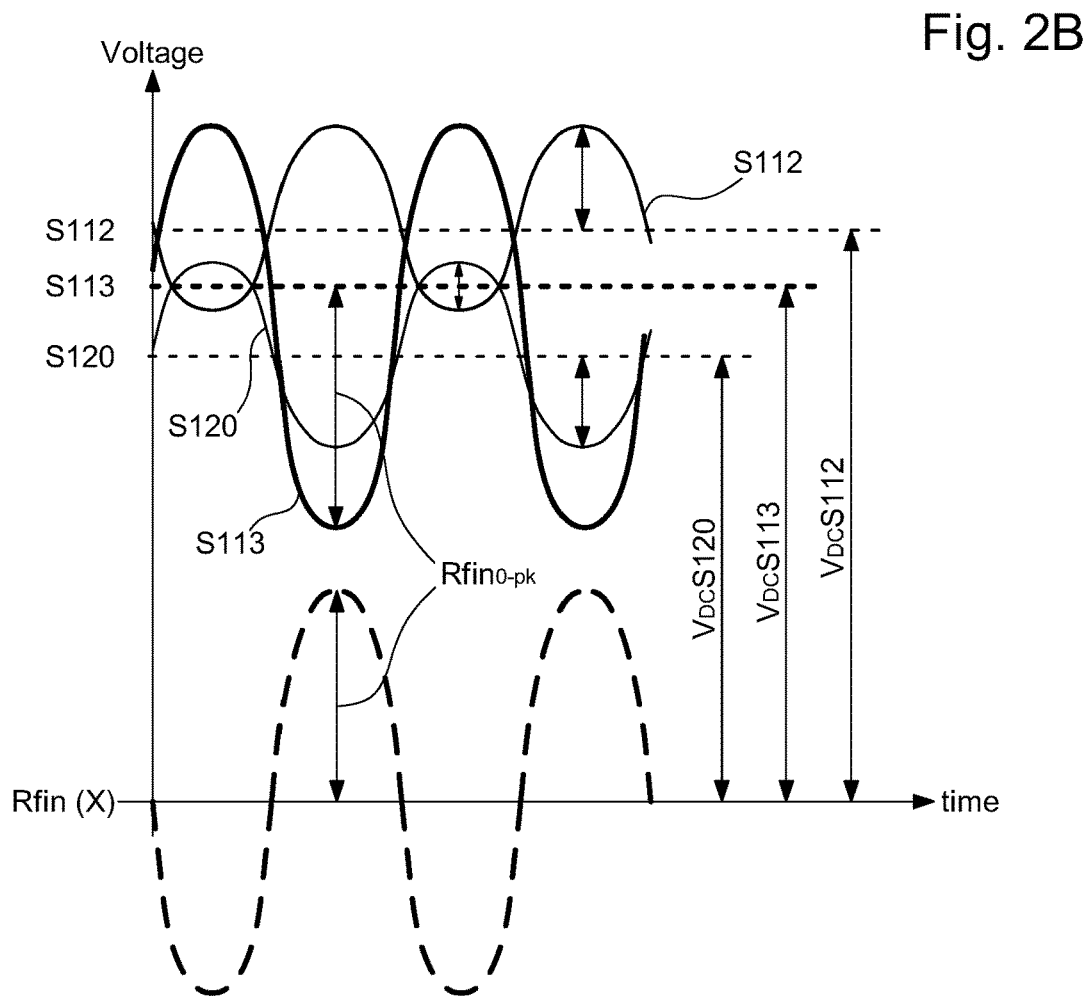

Further, in this embodiment, the gate voltage of said gate 113 may be determined by configuration of said at least one first bias current flow controller 131 and at least one second bias current flow controller 132. More precisely, when the second embodiment comprises at least one resistor as said at least one first bias current flow controller 131 and/or as said at least one second bias current flow controller 132 a resistive divider may be formed and the DC gate voltage $V_{DC}$ S113 may be comprised between the voltage value of said at least one primary signal input 120, referenced $V_{DC}$ S120, and of said second terminal 112, in other words, the added offset to the signal may be comprised between the voltage value of said at least one primary signal input 120, referenced $V_{DC}$ S120, and of said second terminal 112, referenced $V_{DC}$ S112, as shown in FIG. 2B.

Figure 7:
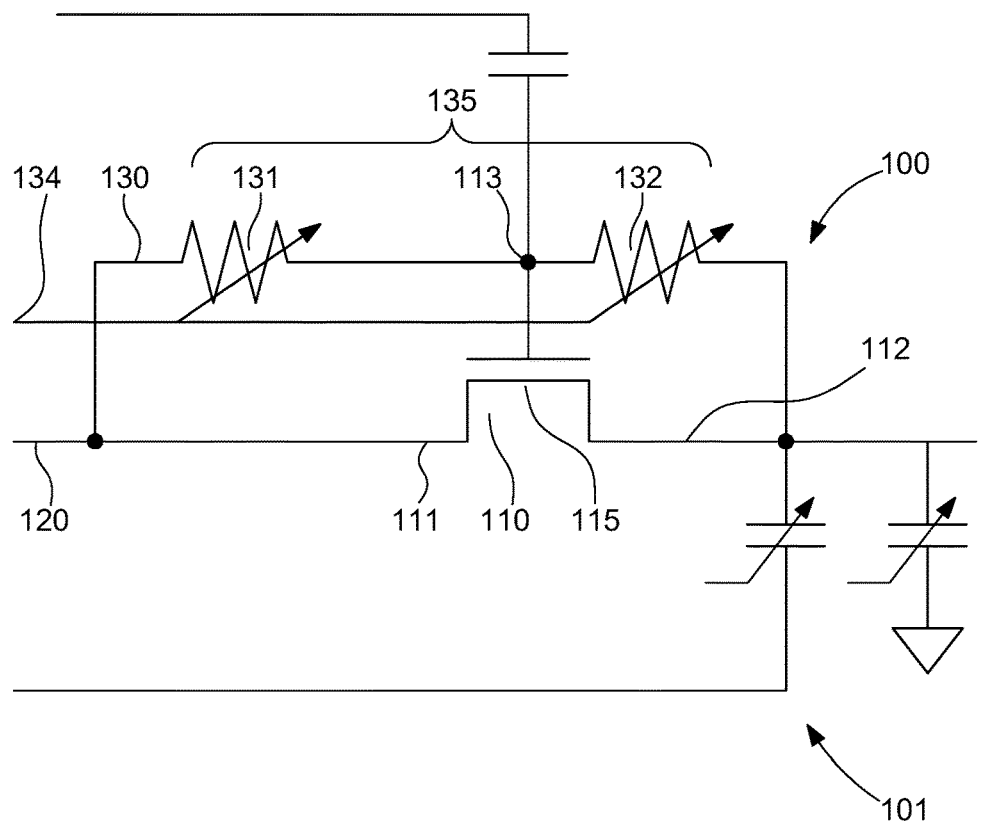
Figure 8:
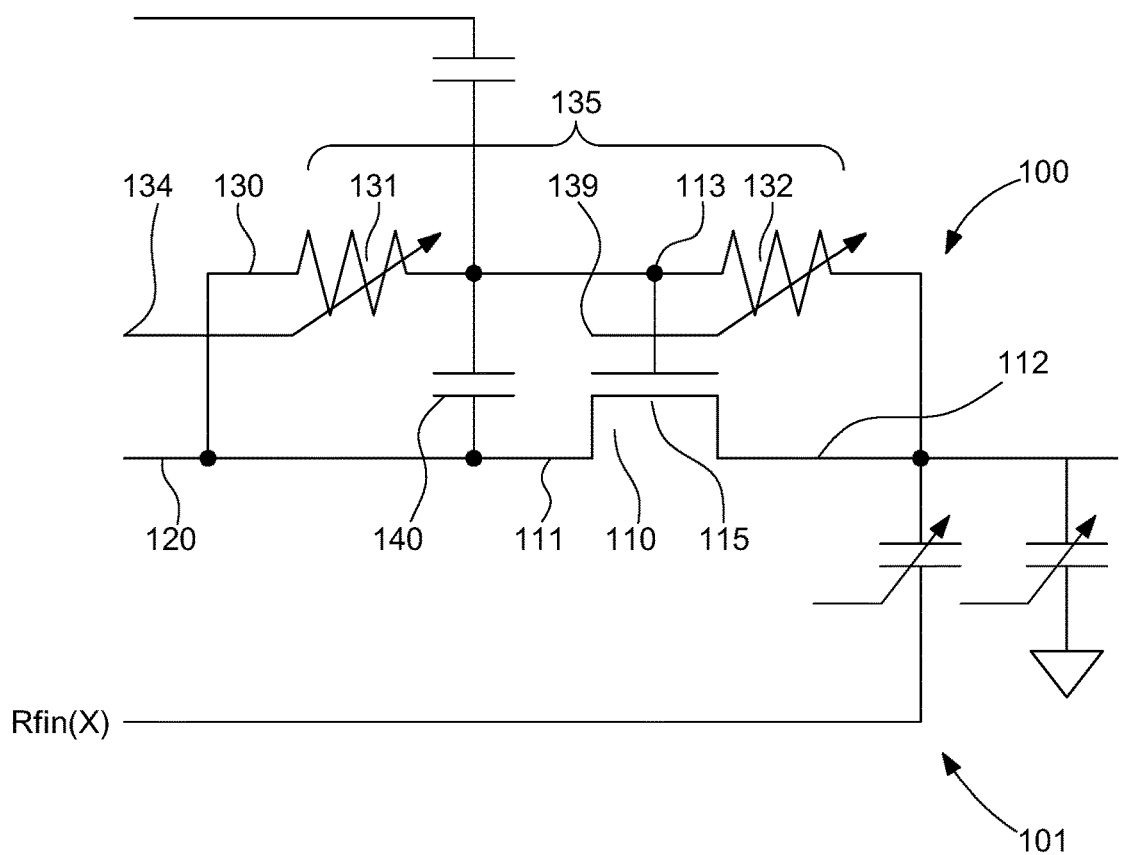

As shown in FIG. 7, said at least one first bias current flow controller 131 may comprise at least one first primary trim input 134 configured to trim the current flowing through said at least one first bias current flow controller 131, referenced S134, and/or wherein said at least one second bias current flow controller 132 may comprise at least one second primary trim input 139 configured to trim the current flowing through said at least one first bias current flow controller 131, as depicted in FIG. 8.

Thanks to the arrangements according to the invention, the conduction path 115 of the switching element 110 may be controlled which makes the charge pump converter programmable via said integrated circuit, said microcontroller and/or said processor.

As it may be construed from the previous description, the bias voltage of said at least one bias input 130 may be made equal to said at least one primary signal input 120 by connecting said at least one bias input 130 to said at least one primary signal input 120. More generally said at least one bias input 130 may be connected to any other gate controller 100 or to a voltage generated external to said gate controller 100.

Said at least one bias input 130 may comprise said at least one first bias current flow controller 131 and/or said at least one second bias current flow controller 132 such that the gate bias voltage of said gate 113 may be controlled by said at least one first bias current flow controller 131 and/or said at least one second bias current flow controller 132 while the radiofrequency gate signal may be controlled by said first control signal of said at least one first secondary signal input 151 at the clock frequency.

Description of the Invention According to a Eighth and Ninth Embodiment

Figure 9:
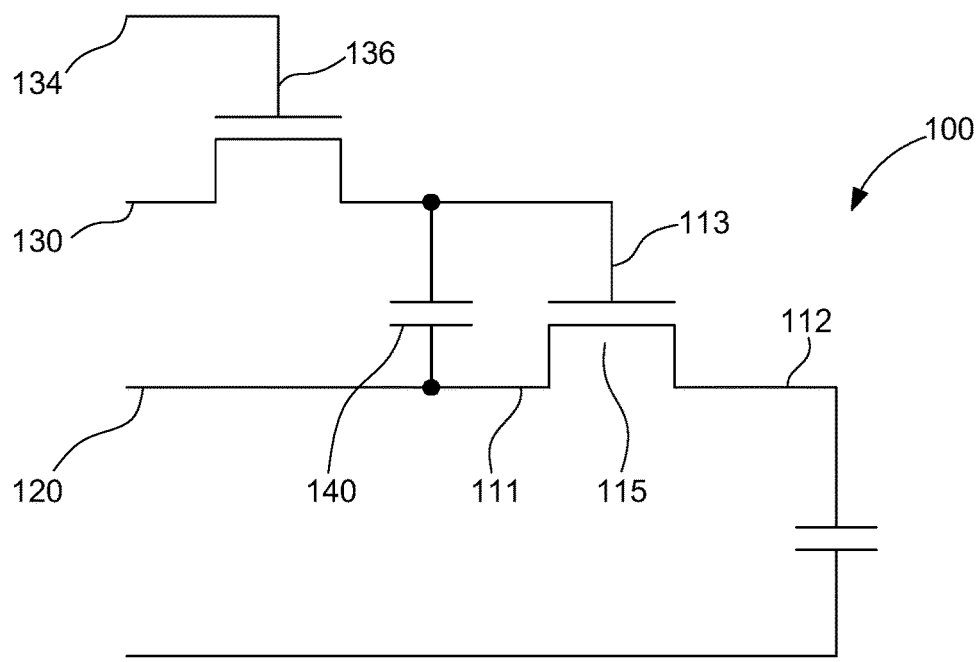

The eight embodiment, shown on FIG. 9, may be an improvement of the previous embodiments and instead of a resistor, as said at least one first bias current flow controller 131 and/or as said at least one second bias current flow controller 132, a transistor and preferably by a MOS may be used. Thus the conduction path 115 of the switching element 110 may be controlled and may make the charge pump converter programmable.

Figure 10A:
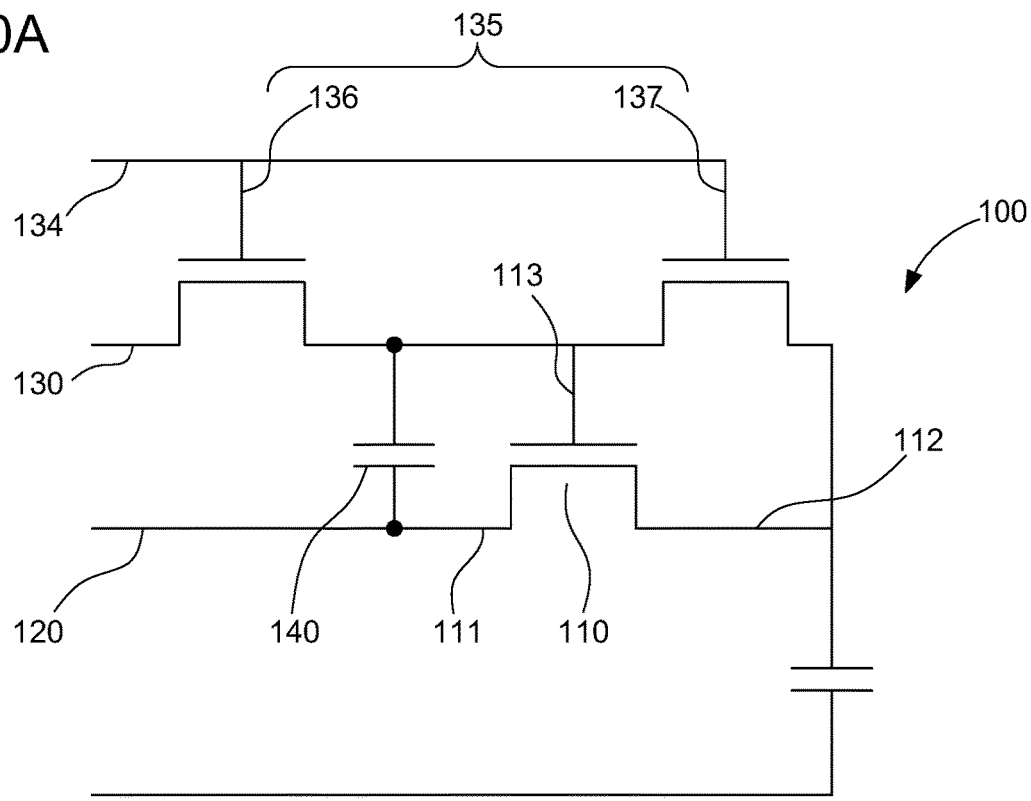
FIGS. 10A and 10B represent gate controllers according to embodiments of the invention.
Figure 10B:
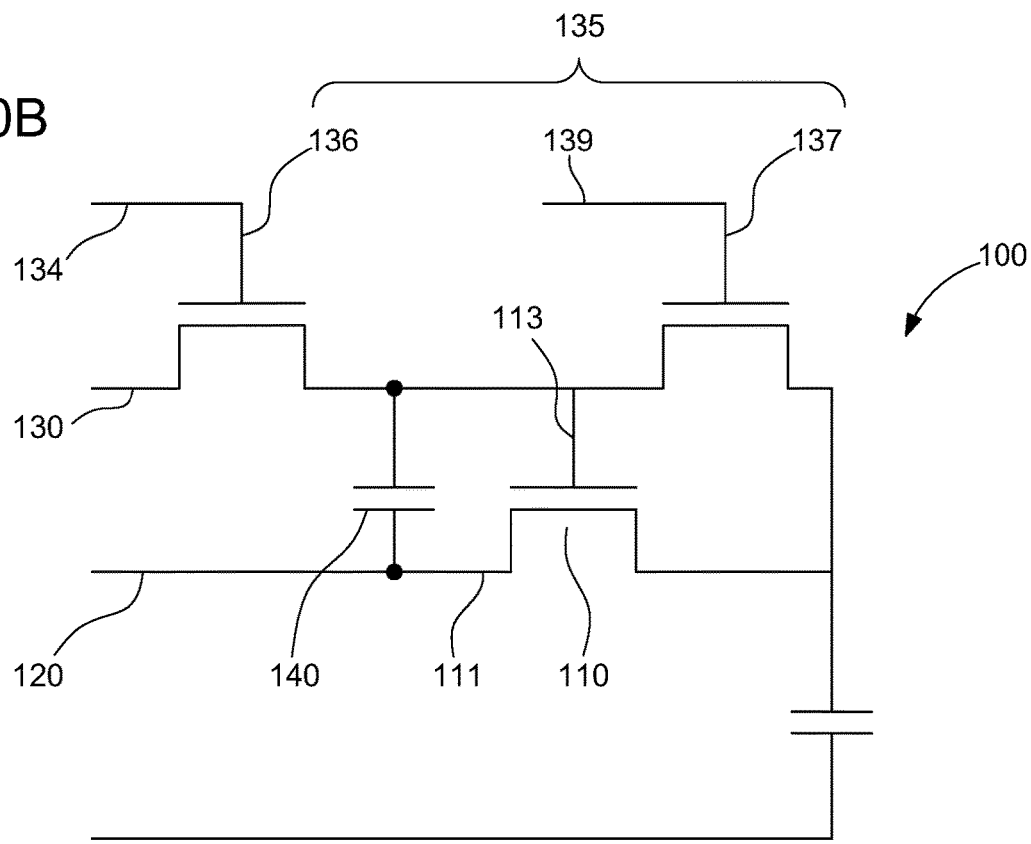

In the ninth embodiment shown on FIGS. 10A and 10B, the potentiometer and/or the digital potentiometer in the previous embodiment may be replaced by a transistor and preferably by a MOS transistor in linear with a controlled channel resistance. Since the plurality of bias current flow controller 135 may comprise at least one first bias transistor 136 and at least one second bias transistor 137, thus the conduction path 115 of the switching element 110 may be controlled and may make the charge pump converter programmable.

As shown in FIGS. 9, 10A and 10B, said at least one first bias transistor 136 may comprise at least one first primary trim input 134 configured to trim the current flowing through and/or said at least one first bias transistor 136 and/or wherein said at least one second bias transistor 137 may comprise at least one second primary trim input 139 configured to trim the current flowing through said at least one first bias transistor 136.

Thanks to the arrangements according to the invention, the conduction path 115 of the switching element 110 may be controlled which makes the charge pump converter programmable via an integrated circuit, a microcontroller and/or a processor.

As it may be construed from the previous description, the present invention relates to a gate controller 100 having a primary signal input 120 which may be AC coupled to the gate 113 through a capacitor 140, one or more bias input 130 each connected to the gate 113 through a resistor 131 such as to control the DC voltage bias of the gate and therefore the conductivity of the switching element.

Said bias inputs can be properly connected to internal nodes of the charge pump, or charge pump stages, such that the gate controller may be self-biased, without using bias-reference external to the charge pump.

Said gate controller can be made programmable by using transistors in place of the bias resistors.

Figure 11:
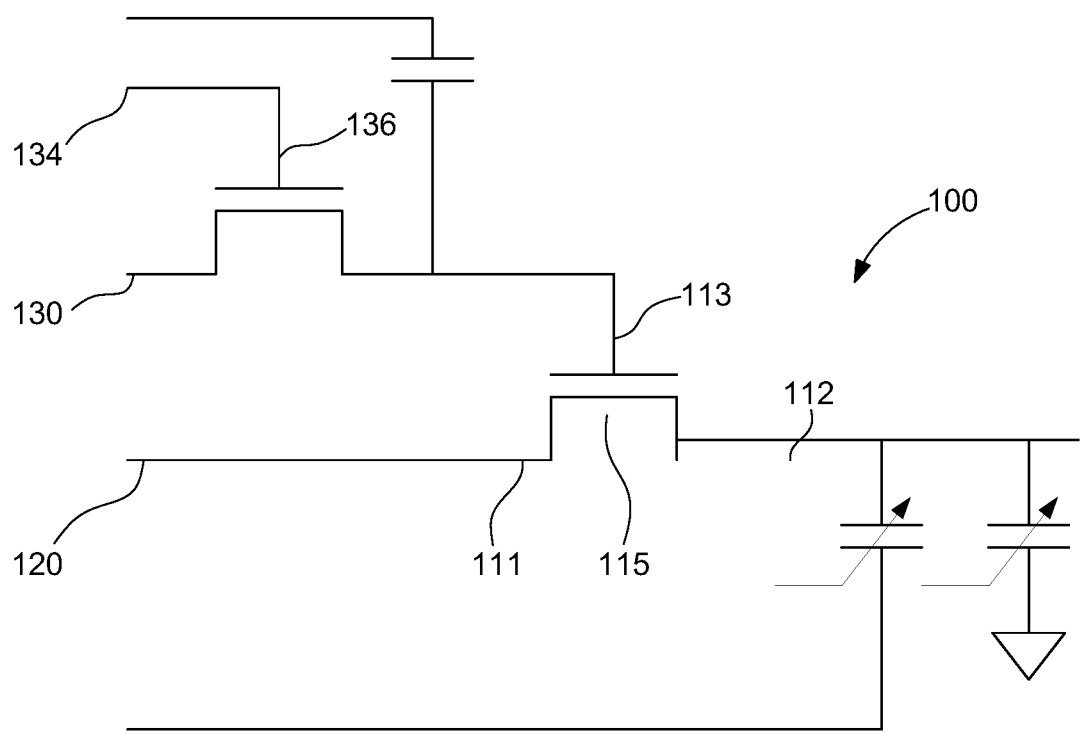
FIGS. 11, 12A and 12B represent gate controllers according to embodiments of the invention.

Said programmable gate controller stages can be connected to form a programmable gate controlled charge pump Description of the Invention According to a Tenth and Eleventh Embodiment The tenth embodiment, shown on FIG. 11, comprises as said at least one first bias current flow controller 131 and/or as said at least one second bias current flow controller 132, a transistor and preferably by a MOS may be used, instead of a resistor. Thus the conduction path 115 of the switching element 110 may be controlled and may make the charge pump converter programmable.

Figure 12A:
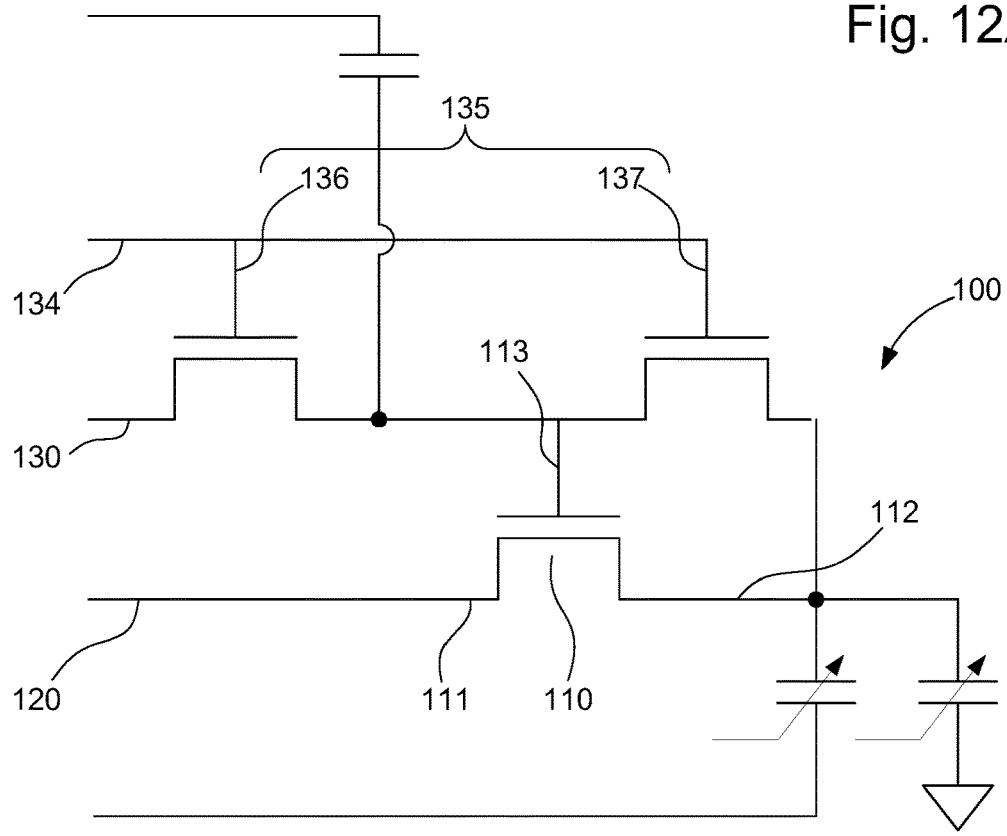
Figure 12B:
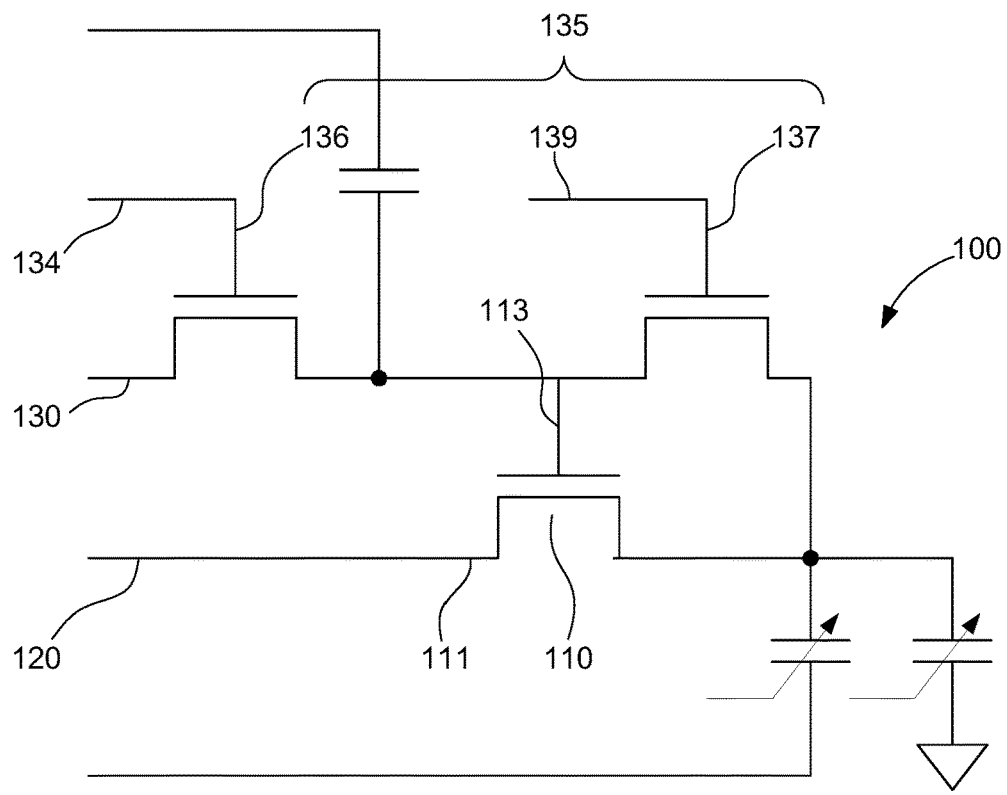

In the eleventh embodiment shown on FIGS. 12A and 12B, the potentiometer and/or the digital potentiometer in the previous embodiment may be replaced by a transistor and preferably by a MOS transistor in linear with a controlled channel resistance. Since the plurality of bias current flow controller 135 may comprise at least one first bias transistor 136 and at least one second bias transistor 137, thus the conduction path 115 of the switching element 110 may be controlled and may make the charge pump converter programmable.

Additionally, the current flowing through said at least one first bias transistor 136 and/or through said at least one second bias transistor 137 may be trimmed via said at least one first primary trim input 134 and/or said at least one second primary trim input 139 via said integrated circuit, said microcontroller and/or said processor.

Further, the capacitance $C_{143}$ of said at least one first secondary capacitor 143 and/or the capacitance $C_{144}$ of said at least one second secondary capacitor 144 may be trimmed trough said at least one first secondary trim input 147 and/or said at least one second secondary trim input 148, such as to trim totally or partially the attenuation or the amplification of said at least one primary signal through said at least one second secondary trim input 148 via said integrated circuit, said microcontroller and/or said processor.

Thanks to the arrangements according to the invention, the conduction path 115 of the switching element 110 and/or the capacitance $C_{143}$, $C_{144}$ of said at least one first secondary capacitor 143 and/or of said at least one second secondary capacitor 144 may be controlled which makes the charge pump converter programmable via said integrated circuit, said microcontroller and/or said processor.

Description of a Charge Pump Converter According to an Embodiment of the Invention As shown in FIG. 13, a charge pump converter, according to the invention, may comprise a plurality of charge pump converter stages 101 in series including at least one first charge pump converter stage 101, a second charge pump converter stage 102 and a third charge pump converter stage 103, and said gate 113 controller 100 according to any precedent embodiment, wherein said plurality of bias current flow controller 135 of said third charge pump converter stage 101 may be connected to said second terminal 112 of said first charge pump converter stage 101 and said at least one bias input 130 of said third charge pump converter stage 101 may be connected to said second terminal 112 of said second charge pump converter stage 101.

As it may be construed from the previous description, the present invention relates to a gate controller 100 having a primary signal input 120 which may be AC coupled to the gate 113 through a capacitor 140, one or more bias input 130 each connected to the gate 113 through a resistor 131 such as to control the DC voltage bias of the gate and therefore the conductivity of the switching element.

Said bias inputs can be properly connected to internal nodes of the charge pump, or charge pump stages, such that the gate controller may be self-biased, without using bias-reference external to the charge pump.

Said gate controller can be made programmable by using transistors or potentiometer in place of the bias resistors. Said programmable gate controller stages can be connected to form a programmable gate controlled charge pump.

Description of a Charge Pump Converter According to Another Embodiment of the Invention As shown in FIG. 15, a charge pump converter, according to another aspect of the invention, may comprise a plurality of said gate 113 controller 100 according to any precedent embodiment.

Indeed, there may be two gate controllers 100, a positive gate controllers 100 and a negative gate controllers 100 put in differential, wherein said at least one first secondary signal input 151 of said positive gate controllers 100 becomes said at least one second secondary signal input 152 of said negative gate controllers 100.

Said positive gate controllers 100 and said negative gate controllers 100 in differential may comprise, as previously mentioned, said at least one primary coupling capacitor 142 configured to be connected directly to said gate 113 and said at least one first secondary signal input 151 configured to be connected directly to said at least primary coupling capacitor 142. Said at least one first secondary signal input 151 may be configured to receive said first control signal, preferably said clock signal being said square wave signal or sinusoidal signal.

Further, said at least one bias input 130 may be connected to the gate 113 through a resistor 131 or a transistor 136 such as to control the DC voltage bias of the gate $V_{DC}$ S130 and therefore the conductivity of the switching element 110 and said at least one second secondary signal input 152 may be configured to be connected directly to said at least one attenuator 145.

As said first embodiment, said at least one switching element 110 comprises said conduction path 115 between said first terminal 111 and said second terminal 112, and said gate 113 controlling the current flowing through said conduction path 115. Said gate controller 100 comprises also at least one primary signal input 120 connected to, preferably directly connected to a second terminal 112 of a following charge pump converter stage, as shown on FIG. 15, and/or to receive a signal, preferably from said antenna, from said integrated circuit and/or from another charge pump converter stage such as to form said charge pump converter.

The invention claimed is:

1. Gate controller (100) for a charge pump converter stage (101), said charge pump converter stage (101) comprising at least one switching element (110) having a conduction path (115) with a first terminal (111) and a second terminal (112), and a gate (113) configured to control the current flowing through said conduction path (115), said conduction path (115) being configured to provide at least one signal; said gate controller (100) comprising at least:
   one primary signal input (120): said at least one primary signal input (120) is directly connected to a second terminal of another charge pump converter stage to receive a signal from said another charge pump converter stage and to transfer said signal to said first terminal (111) of conduction path (115) of said at least one switching element (110);
   at least one bias input (130): said at least one bias input (130) is connected to said gate (113) through a resistor (131) and configured to establish a voltage value and/or a current value of said gate (113); and
   at least one coupling capacitor (140) configured to connect said gate (113) to said at least one primary signal input (120) and to connect said conduction path (115) of said at least one switching element (110) to said gate (113).

2. The gate controller (100) according to claim 1, which comprises at least one primary coupling capacitor (142) configured to be connected directly to said gate (113) and at least one first secondary signal input (151) configured to be connected directly to said at least primary coupling capacitor (142); said at least one first secondary signal input (151) is configured to receive a first control signal.

3. The gate controller (100) according to claim 1, which comprises at least one attenuator (145) and at least one second secondary signal input (152) configured to be connected directly to said at least one attenuator (145); said at least one second secondary signal input (152) is configured to receive at least one secondary signal.

4. The gate controller (100) according to claim 3, wherein said at least one attenuator (145) comprises at least one first secondary capacitor (143) configured to be connected directly between said at least one second secondary signal input (152) and said second terminal (112).

5. The gate controller (100) according to claim 4, wherein said at least one attenuator (145) comprises at least one second secondary capacitor (144) configured to be connected directly between said ground and said second terminal (112).

6. The gate controller (100) according to claim 5, wherein said at least one attenuator (145) comprises at least one first secondary trim input (147) configured to trim the capacitance of said at least one first secondary capacitor (143) and/or the capacitance of said at least one second secondary capacitor (144), and/or wherein said at least one attenuator (145) comprises at least one second secondary trim input (148) configured to trim said capacitance of said at least one second secondary capacitor (144).

7. The gate controller (100) according to claim 1, wherein said at least one bias input (130) is directly connected to said at least one primary signal input (120).

8. The gate controller (100) according to claim 1, wherein said at least one bias input (130) comprises a plurality of bias current flow controller (135) comprising at least one first bias current flow controller (131) and/or at least one first bias transistor (136).

9. The gate controller (100) according to claim 8, wherein said plurality of bias current flow controller (135) comprises at least one second bias current flow controller (132) and/or at least one second bias transistor (137).

10. The gate controller (100) according to claim 9, wherein said at least one second bias current flow controller (132) is directly connected to said gate (113) and said second terminal (112) of conduction path (115) of said at least one switching element (110).

11. The gate controller (100) according to claim 10, wherein said at least one first bias current flow controller (131) comprises at least one resistor, a potentiometer and/or a digital potentiometer, and/or wherein said at least one second bias current flow controller (132) comprises at least one resistor, a potentiometer and/or a digital potentiometer.

12. The gate controller (100) according to claim 10, wherein said at least one first bias current flow controller (131) and/or said at least one first bias transistor (136) comprises or comprise at least one first primary trim input (134) configured to trim the current flowing through said at least one first bias current flow controller (131) and/or said at least one first bias transistor (136), and/or wherein said at least one second bias current flow controller (132) and/or said at least one second bias transistor (137) comprises or comprise at least one second primary trim input (139) configured to trim the current flowing through said at least one first bias current flow controller (131) and/or said at least one first bias transistor (136).

13. The gate controller (100) according to claim 1, wherein said at least one bias input (130) is directly connected to said gate (113) through the resistor (131) and configured to establish a voltage value and/or a current value of said gate (113).

* * * * *